(12) United States Patent
Marte et al.

(10) Patent No.: US 9,924,570 B2
(45) Date of Patent: Mar. 20, 2018

(54) ISOLATED ACTIVE CIRCUIT FOR MEASURING THE CURRENT OF AN ILLUMINANT ON THE SECONDARY SIDE

(71) Applicant: TRIDONIC GMBH & CO KG, Dornbirn (AT)

(72) Inventors: Patrick Marte, Gotzis (AT); Johannes Bachmann, Gotzis (AT)

(73) Assignee: TRIDONIC GMBH & CO KG (AT)

( * ) Notice: Subject to any disclaimer, the term of this patent is extended or adjusted under 35 U.S.C. 154(b) by 0 days.

(21) Appl. No.: 15/329,355

(22) PCT Filed: Jul. 14, 2015

(86) PCT No.: PCT/EP2015/066049
§ 371 (c)(1),
(2) Date: Jan. 26, 2017

(87) PCT Pub. No.: WO2016/015995
PCT Pub. Date: Feb. 4, 2016

(65) Prior Publication Data
US 2017/0231039 A1  Aug. 10, 2017

(30) Foreign Application Priority Data

Jul. 28, 2014 (DE) .................. 10 2014 214 744

(51) Int. Cl.
*H05B 33/08* (2006.01)
*G01R 19/00* (2006.01)
(Continued)

(52) U.S. Cl.
CPC ..... *H05B 33/0815* (2013.01); *G01R 19/0092* (2013.01); *G01R 31/2635* (2013.01);
(Continued)

(58) Field of Classification Search
None
See application file for complete search history.

(56) References Cited

U.S. PATENT DOCUMENTS

| 5,574,338 A | 11/1996 | Kuusisto et al. |
| 7,589,480 B2 | 9/2009 | Greenwood et al. |

(Continued)

FOREIGN PATENT DOCUMENTS

| CN | 102636676 | 8/2012 |
| EP | 2770623 | 8/2014 |

(Continued)

OTHER PUBLICATIONS

Liu et al., A New Current Sensing Scheme for Zero-Voltage Switching Phase-Shifted Bridge Converter, INTELEC. 22nd International Telecommunications Energy Conference, pp. 567-573.

(Continued)

*Primary Examiner* — Jany Richardson
(74) *Attorney, Agent, or Firm* — Andrus Intellectual Property Law, LLP

(57) ABSTRACT

The invention relates to a drive circuit for operating an illuminant, preferably at least one LED, comprising an isolated converter which is clocked on the primary side by a control unit by means of at least one controlled switch unit, said converter supplying a rectifier starting from which the illuminant can be fed, a measurement circuit for indirectly measuring the current on the secondary side of the converter having a transformer with at least one winding on the primary side.

10 Claims, 7 Drawing Sheets

(51) Int. Cl.
    *H02M 3/335*     (2006.01)
    *H02M 1/08*     (2006.01)
    *H02M 3/337*     (2006.01)
    *G01R 31/26*     (2014.01)
    *H02M 1/00*     (2006.01)

(52) U.S. Cl.
    CPC ............. *H02M 1/08* (2013.01); *H02M 3/337* (2013.01); *H02M 3/33592* (2013.01); *H02M 2001/0009* (2013.01)

(56) References Cited

U.S. PATENT DOCUMENTS

| | | |
|---|---|---|
| 2006/0055337 A1 | 3/2006 | Wey et al. |
| 2010/0244726 A1 | 9/2010 | Melanson |
| 2011/0037414 A1* | 2/2011 | Wang ................ H05B 33/0815 315/297 |
| 2012/0194078 A1 | 8/2012 | Ren et al. |

FOREIGN PATENT DOCUMENTS

| | | | |
|---|---|---|---|
| EP | 2741409 | 11/2014 | |
| WO | 2012106967 | 8/2012 | |
| WO | 2012132048 | 10/2012 | |
| WO | 2014060899 | 4/2014 | |
| WO | WO 2015082288 A1 * | 6/2015 | ......... H05B 33/0815 |

OTHER PUBLICATIONS

Wang et al., A Method of Reducing the Peak-to-Average Ratio of LED Current for Electrolytic Capacitor-Less AC-DC Drivers, IEEE Transactions on Power Electronics, vol. 25, No. 3, Mar. 2010, pp. 592-601.
AN-9729 LED Application Design Guide Using Half-Bridge LLC Resonant Converter for 100W Street Lighting, Nov. 16, 2012; URL: http://www.fairchildsemi.com/an/AN/AN-9729.
German Search Report on German parent application 10 2014 214 744.1 dated Mar. 27, 2015.
PCT Search Report on parent PCT Application PCT/EP2015/066049 dated Sep. 28, 2015.
Austria Search Report on co-pending Austria Application GM 363/2014 dated Jul. 8, 2016.

* cited by examiner

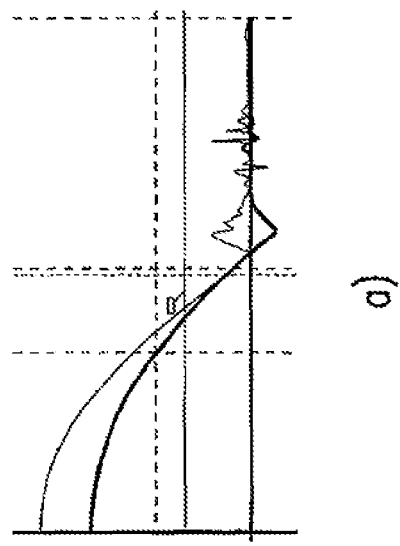
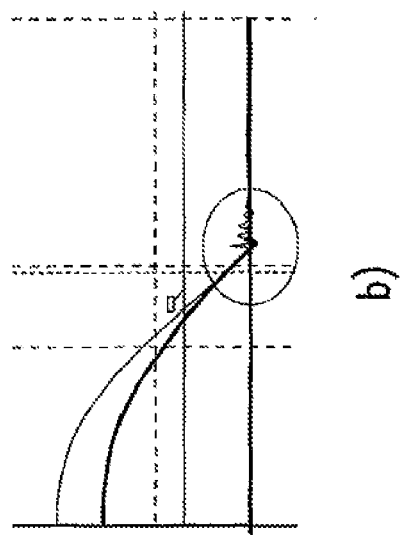
Fig. 4

ISOLATED ACTIVE CIRCUIT FOR MEASURING THE CURRENT OF AN ILLUMINANT ON THE SECONDARY SIDE

CROSS REFERENCE TO RELATED APPLICATION

The present application is the U.S. national stage application of International Application PCT/EP2015/066049, filed Jul. 14, 2015, which international application was published on Feb. 4, 2016 as International Publication WO 2016/015995 A1. The International Application claims priority of German Patent Application 10 2014 214 744.1, filed Jul. 28, 2014.

FIELD OF THE INVENTION

The invention relates to an active circuit, in particular a drive circuit, for measuring a current through an illuminant line having at least one LED. In particular, the invention relates to an active circuit that is divided by a potential-isolating and/or galvanically insulating barrier (e.g. a safety extra-low voltage barrier (SELV barrier)) into a primary side supplied by a supply voltage, and a secondary side supplying the illuminant line.

BACKGROUND

It is known that with such circuits, an energy transfer takes place from the primary side of the circuit to the secondary side of the circuit. In particular, the transfer from the primary side to the secondary side of the circuit occurs via the barrier by means of a converter, in particular a transformer, which induces a voltage or a current on the secondary side by means of an electromagnetic coupling. It is thus possible to supply the secondary side via the barrier.

In order to determine the illuminant current passing through the illuminant, or the illuminant line, which can be used to regulate the brightness of the illuminant, it is known to carry out a determination of the illuminant current on the secondary side. This is disclosed, for example, in WO 2014/060899. It is furthermore known that, as is shown by way of example in FIG. 1, a control circuit SE activates, directly or indirectly, a switch unit S having a clocked switch, e.g. via a drive unit.

The switch unit S can have, for example, a single clocked switch, or numerous clocked switches. Thus, the switch unit S can comprise, in particular, an inverter having a high-side switch, and low-side switch in comparison thereto.

Starting from the switch unit S, a converter winding L2_1 (inductivity coil) is then supplied. This converter winding L2_1 can be a component of an LLC circuit thereby, and be fed from a midpoint of the inverter. In particular, a converter (e.g. resonance converter, LLC converter) is thus fed, from which the secondary side of the circuit is fed by means of an electromagnetic coupling of the primary side-converter winding L2_1 and the secondary side-converter windings L2_2, L2_3 (shown here as separate windings L2_2, L2_3, coupled magnetically) via a barrier B.

LED terminals LED+ and LED− are supplied with a DC voltage, smoothed out via a smoothing capacitor C2, via the diodes D1 and D2, which form a rectifier, in order to operate the illuminant.

An auxiliary winding Lh is provided with a measurement circuit E on the secondary side of the circuit, wherein the auxiliary winding Lh is coupled electromagnetically with the primary side winding L2_1. The measurement circuit E then measures, by means of the auxiliary winding Lh, a current induced on the secondary side of the circuit, or records a parameter reflecting it. The corresponding parameter reflecting the current is determined thereby through the measurement circuit E, and returned to the control unit SE via the barrier B, via a bypass element X, which can be an optocoupler or another transformer. The control unit SE can then evaluate the parameter as the actual value of the current passing through the illuminant, and use it for regulating the illuminant. In doing so, the control unit SE can compare, in particular, the actual value for the current with a target value, and activate the switch unit S accordingly.

The circuit depicted in FIG. 1 has, in this regard, the disadvantage that, for one thing, the measurement circuit E must be provided on the secondary side of the circuit, and that furthermore, a bypass element X is required for bypassing the barrier B, which leads to relatively high circuit costs and complicated circuit assemblies.

SUMMARY OF THE INVENTION

For this reason, it is the aim of the invention to provide a circuit, which enables a primary side recording of a parameter reflecting the current passing through the illuminant. In particular, the object of the invention is to provide a possibility for recording a parameter reflecting the current passing through the illuminant on the primary side of the circuit, thus preventing measurement errors.

One solution for this objective shall be described below.

In a first aspect of the invention, a circuit is provided, in particular a drive circuit for operating an illuminant, preferably at least one LED, having an isolated, primary side converter, clocked by a control unit by means of at least one activated switch unit, which feeds a rectifier, from which the illuminant can be supplied with current. A measurement circuit for the indirect measurement of the current at the secondary side of the converter has a transformer having at least one primary side winding.

The measurement circuit can have a measurement rectifier, preferably an active measurement rectifier.

A parameter reflecting the current passing through the illuminant can be returned to the control unit from an output of the measurement circuit. In particular, the output can be connected directly or indirectly to a measurement input of the control unit.

The switch unit can be a half-bridge or full-bridge inverter.

The at least one primary side winding can be a component of a resonance converter, in particular, an LLC circuit, a flyback converter, a push-pull flux converter, a step-up (boost) or step-down (buck) converter.

The control unit can control rectifier switches of the active measurement rectifier of the measurement circuit, depending on the activation of the at least one switch.

The switch unit can have at least one transistor, in particular a FET or MOSFET. The other switches of the circuit can also be designed as transistors (FET, MOSFET, . . . ).

The control unit can activate/deactivate a first diagonal of the active measurement rectifier, synchronously with first inverter switch. The control device can activate/deactivate a second diagonal of the active measurement rectifier, synchronously with the second inverter switch. In each case, only the first or second diagonal can be active.

The secondary winding of the transformer can be a component of each of the diagonals of the active measurement rectifier.

The first and second diagonals can each have at least one, preferably two, rectifier switches. Preferably, each rectifier switch can be connected to a terminal of the secondary winding of the transformer.

Each of the diagonals can have a rectifier switch and a diode.

The control unit can first activate a diagonal of the active measurement rectifier after a certain time, i.e. after a down time following the deactivation of the other diagonals of the active measurement rectifier.

In a further aspect, the invention provides a method for recording a parameter reflecting the current passing through an illuminant, preferably at least one LED, wherein an isolated, primary side, clocked converter, activated by a control unit by means of at least one switch unit, feeds a rectifier, from which the illuminant is supplied with current. A measurement circuit can measure a current indirectly on the secondary side of the converter at a transformer having at least one primary side winding on the secondary side of the converter.

BRIEF DESCRIPTION OF THE DRAWINGS

The invention shall also be described in reference to the drawings. Therein:

FIG. 4 shows, by way of example, curves of recorded parameters.

DETAILED DESCRIPTION

Figure 1:
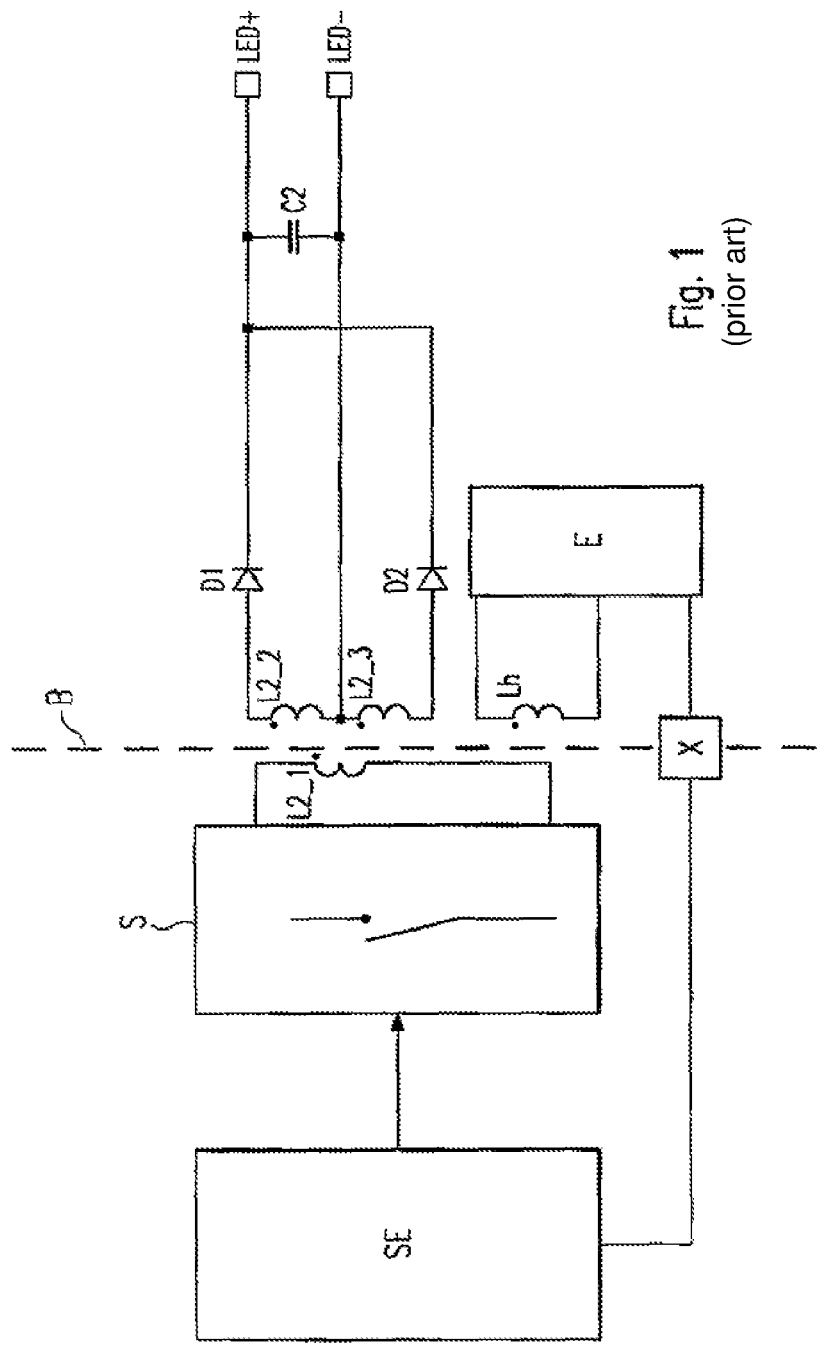
FIG. 1 shows, schematically, a known embodiment according to the prior art.
Figure 2:
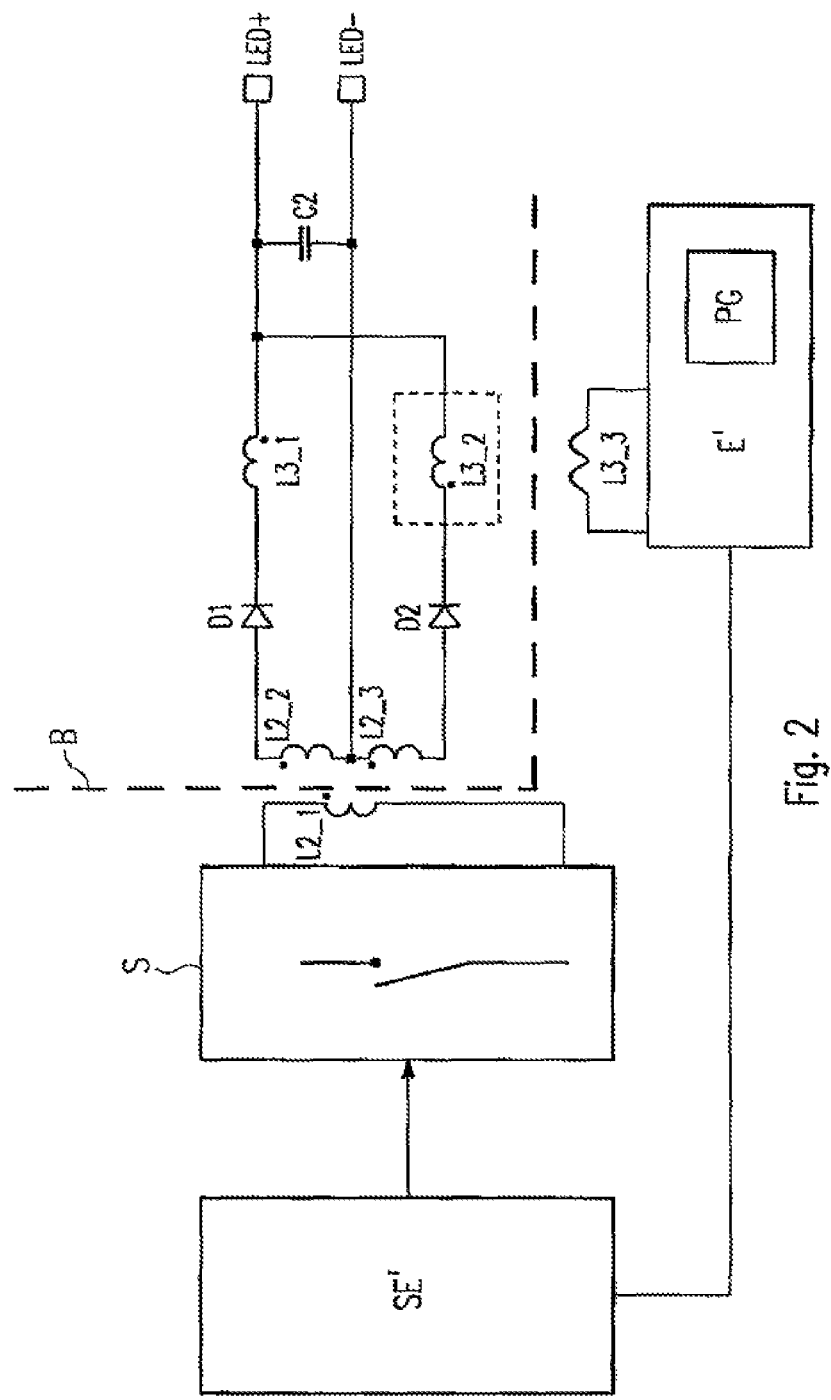
FIG. 2 shows, schematically, a first embodiment according to the invention.

FIG. 2 shows a first embodiment of the inventive circuit, in which substantially identical circuit components are indicated with the same reference symbols as those in FIG. 1. As can be seen in FIG. 2, a diode is connected in series to at least one secondary converter winding L2_2, L2_3 (two converter windings may also be provided, as depicted, which are preferably coupled to one another magnetically), which in turn is connected in series with a primary winding L3_1 of a transformer. The primary winding L3_1 of the transformer is disposed thereby in the supply path of the illuminant terminal LED+.

The primary winding L3_1 of the transformer is electromagnetically coupled to a secondary winding L3_3 of the transformer.

A primary side further primary winding L3_2 of the transformer, connected in series to a diode D2, is shown by way of example in FIG. 2 in a box formed by a broken line, which may be provided optionally.

The secondary winding L3_3 of the transformer is connected thereby to a measurement circuit E', which has a passive measurement rectifier PG. This rectifies the voltage transferred, in particular in an alternating manner, through the primary windings L3_1, L3_2 of the transformer into a DC voltage.

Thus, a recording of the parameter reflecting the current passing through the illuminant can occur at an output of the passive measurement rectifier PG, e.g. via a current-sensing resistor. The parameter is returned, in turn, to a control unit SE', which preferably evaluates it as the actual value for the current passing through the illuminant (not shown), and executes a corresponding regulation. Terminals LED− and LED+ are provided for connecting the illuminant, which preferably includes one LED, as in FIG. 1.

Figure 3:
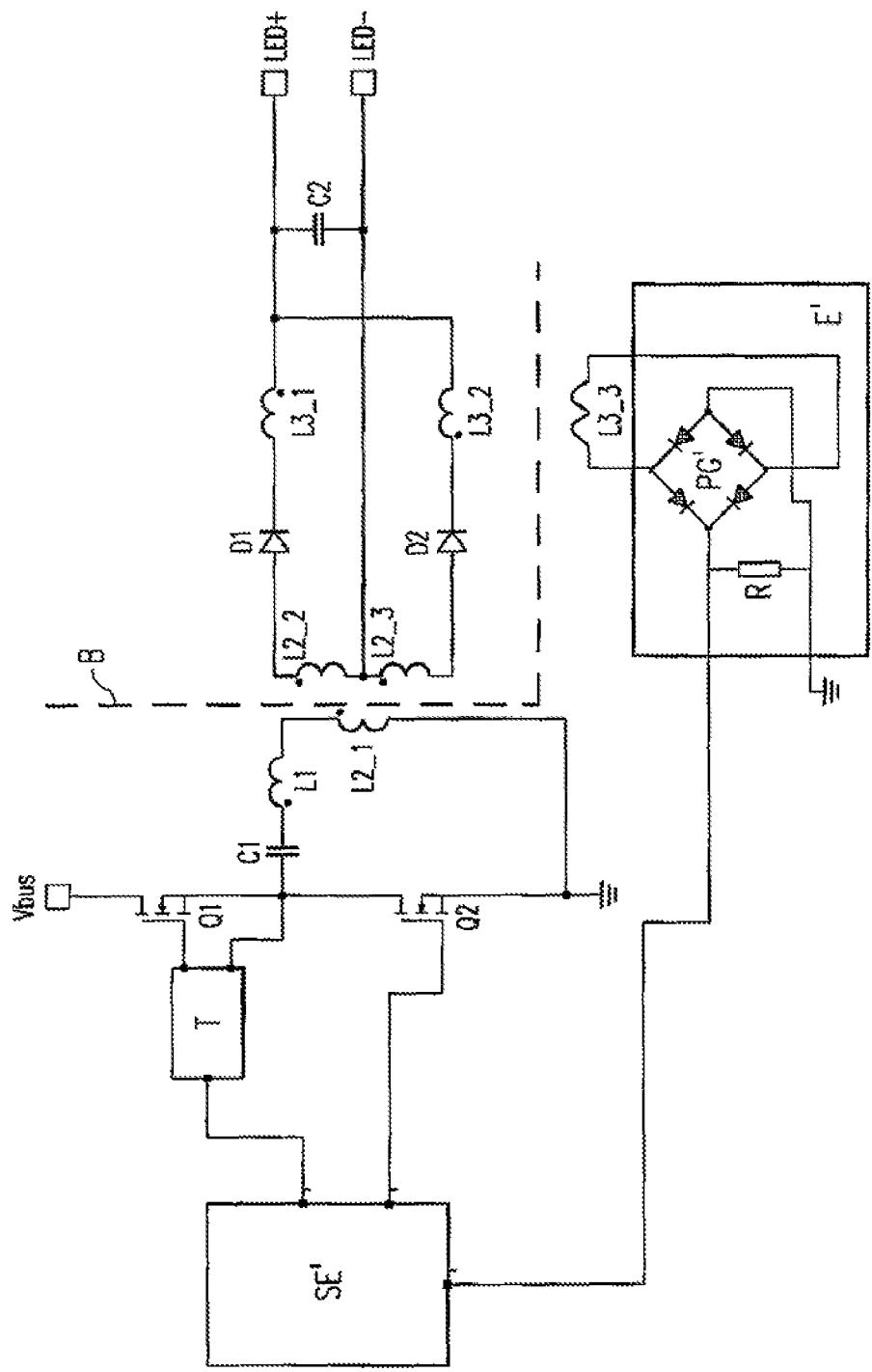
FIG. 3 shows, by way of example, a detailed circuit assembly in accordance with the first embodiment of the invention.

An exemplary design of the embodiment in FIG. 2 is shown in FIG. 3. Here as well, identical circuit components are indicated with the same reference symbols as those in FIGS. 1 and 2.

In particular, a control unit SE' is provided in FIG. 3, which activates an inverter having a first inverter switch Q1 and a second inverter switch Q2. The first inverter switch Q1 is a "high-side" switch here, thus the switch "above" the load, or the switch having the higher potential, and is activated via a drive T, while the second inverter switch Q2 represents a "low-side" switch (switch "below" the load, or a switch having a lower potential).

A resonance converter (here an LLC converter), having a capacitor C1, and inductor L1, and a primary converter winding L2_1, is fed, starting from a midpoint between the first and second inverter switches Q1, Q2 of the depicted inverter half-bridge.

The secondary side of the circuit is substantially identical to that in FIG. 2. Here as well, one of the primary windings L3_1, L3_2 of the transformer may be provided optionally.

Furthermore, the passive measurement rectifier PG' is formed as a component of the measurement circuit E' on the primary side of the circuit, as a diode full bypass, and the control unit SE' records a parameter reflecting the current passing through the illuminant at its output, via a measurement resistor R.

The parameter reflecting the current passing through the illuminant can then be recorded on the primary side of the circuit with the assemblies from FIG. 2 and FIG. 3. Because, in particular, both of the half-waves supplied to the illuminants are transferred in a transformed manner, corresponding current values for both half-waves can also be measured.

It is problematic, however, that the diodes D1, D2 typically deployed as rectifiers on the secondary side of the circuit exhibit a "reverse current" at high temperatures, i.e. a direct deactivation through the diodes D1, D2, does not occur, but rather, a current flows through the diodes D1, D2 of the rectifier in the reverse direction of the diodes D1, D2.

Due to the transformative decoupling and the rectification through the passive measurement rectifier PG', there is an error potential, which strongly disrupts the signal recorded by the control unit SE', particularly at high temperatures.

This is clear from the curves shown by way of example in FIGS. 4a and 4b, wherein FIG. 4a illustrates a curve at high temperatures. In the depiction, the thick curve, initially descending from left to right, represents the curve of a current passing through the diode D1, while the thin curve, descending from left to right, represents the signal recorded at the measurement resistor R.

The passive measurement rectifier PG' is not, however, capable of correctly outputting the negative "reverse current" of the diode, leading to a displacement of the measured signal that is recorded at the measurement resistor R.

Corresponding curves for the lower temperatures are show in FIG. 4b. It is clear from FIG. 4b that as the temperature decreases, the effect of the "reverse current" on the diode D1 also decreases in a corresponding manner. Thus, the measurement error at lower temperatures is reduced. The recorded, and falsely measured as positive, "reverse current" is much lower at the lower temperatures. The relevant range is indicated in FIG. 4b.

It is to be understood that a corresponding signal curve can also be obtained for the diode D2, such that a corresponding error addition is obtained for each of the half-waves induced by the at least one primary transformer winding L3_1, L3_2 in the secondary transformer winding L3_3.

Furthermore, it is to be understood that in addition to an LLC converter, as is depicted in FIGS. 1 and 2, other converters could be used, e.g. flyback converters, buck or boost converters, and in particular other topologies of other clocked, isolated converters. On the whole, the invention thus relates to the measurement of the LED current, wherein this current is determined, starting from an AC voltage, which is rectified by means of the diodes D1, D2. A measurement of the LED current thus occurs indirectly, via the transformer, which has two primary windings L3_1 and L3_2, which are connected in series with one of the diodes D1, D2 respectively.

Figure 5:
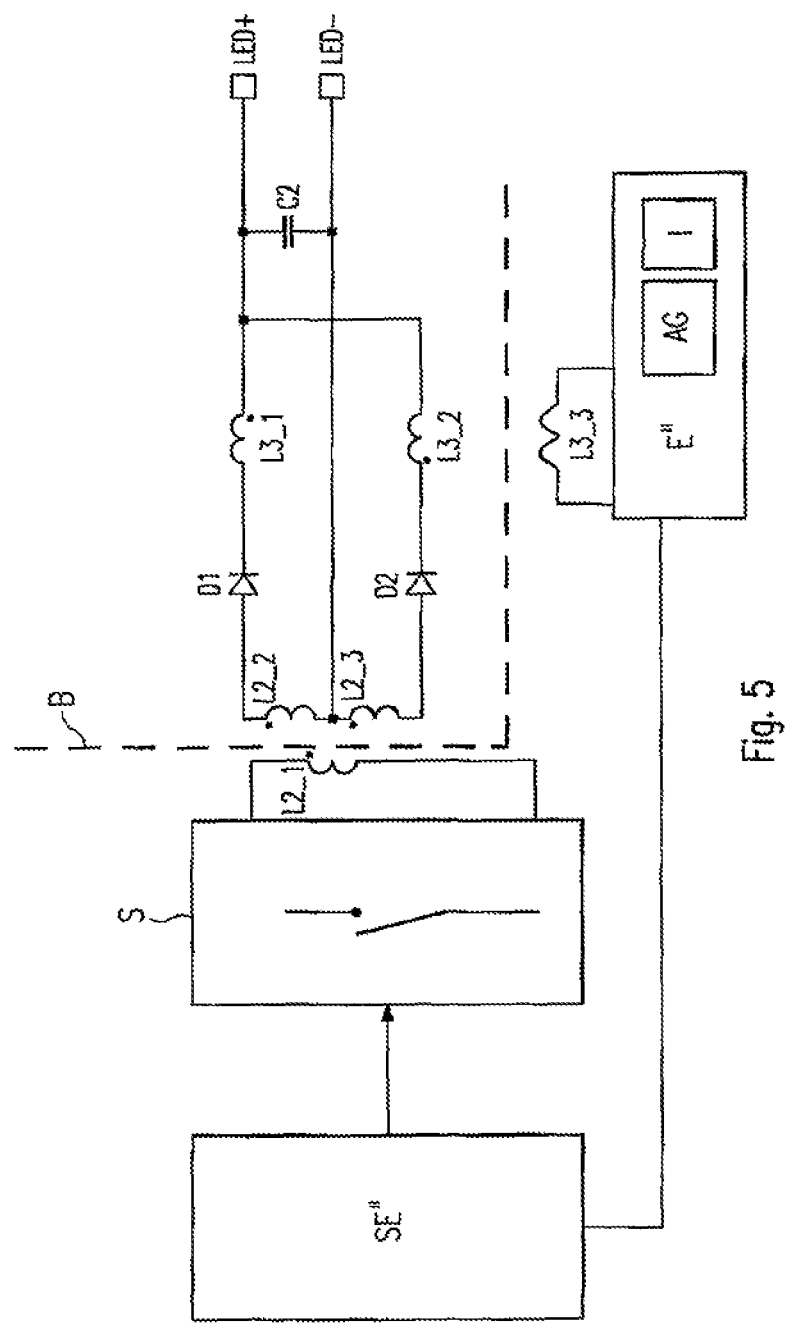
FIG. 5 shows, schematically, a second embodiment according to the invention.

The circuit depicted in FIG. 5 then allows for a measurement of an LED current on the primary side of the measurement circuit while simultaneously preventing measurement errors caused by the "reverse current."

In comparison with FIG. 2 or FIG. 3, the passive measurement rectifier PG, PG' is replaced by an active measurement rectifier AG in a measurement circuit E", in which the secondary winding of the transformer L3_3 is connected to at least two rectifier switches, and preferably, four rectifier switches.

The rectifier switches are activated thereby, such that in each case, a diagonal of the rectifier is active, i.e. is switched on, such that ultimately a tapping into the secondary winding occurs in an alternating manner. Preferably, the control unit SE" activates the rectifier switch thereby, which also activates the switch unit S.

Substantially identical elements are also indicated with the same reference symbols in FIG. 5 as those in the preceding figures.

Figure 6:
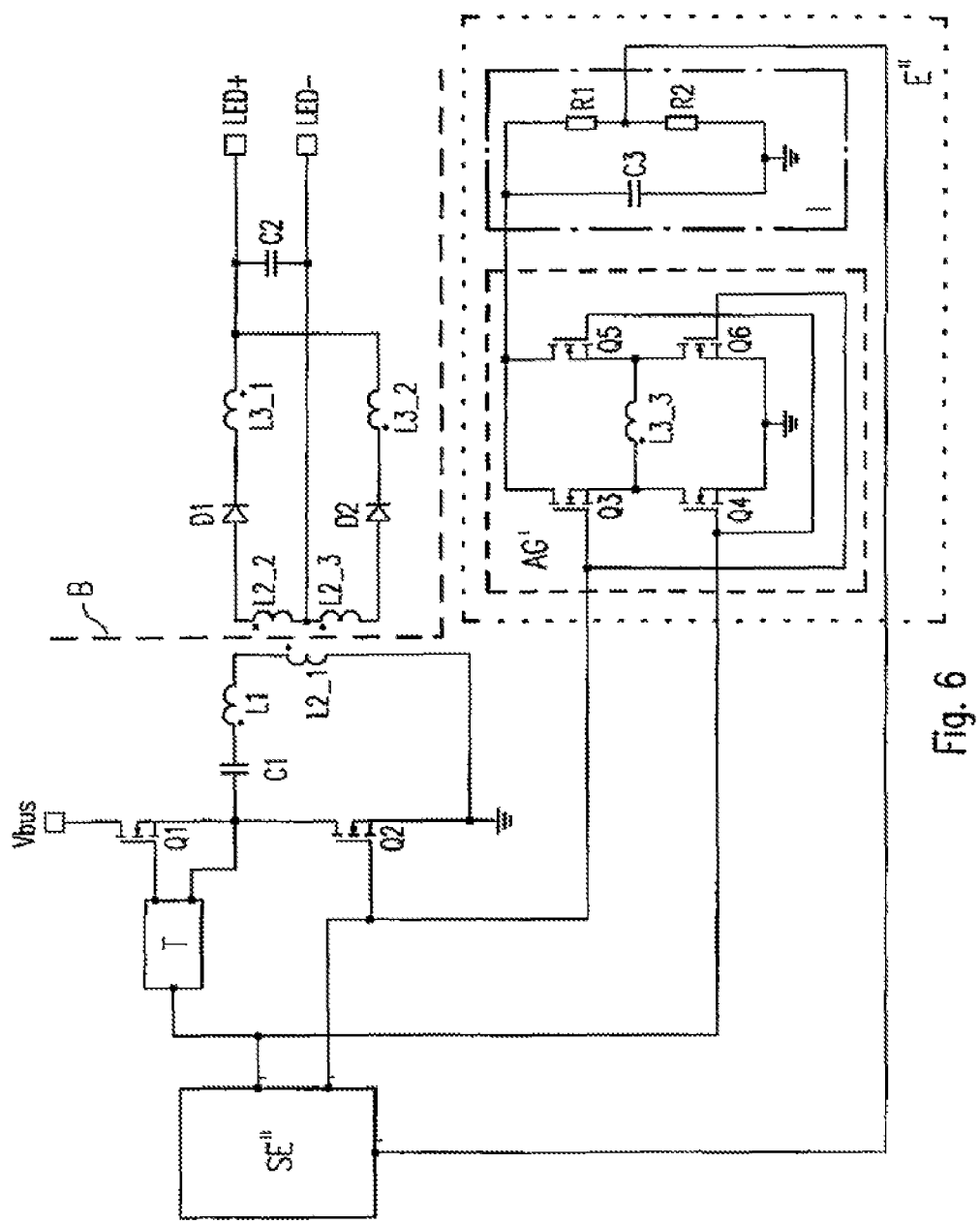
FIG. 6 shows, by way of example, a detailed circuit assembly in accordance with the second embodiment of the invention.

An exemplary design of the embodiment from FIG. 5 is shown in FIG. 6. This is based on the exemplary circuit assembly in accordance with the first embodiment shown in FIG. 3. Circuit components already shown substantially in FIG. 3 are indicated analogously, accordingly.

In particular, the active measurement rectifier AG' is shown in FIG. 6, wherein the secondary winding L3_3 of the transformer is connected to a first rectifier switch Q3 and a second rectifier switch Q6, and forms a first diagonal, while the secondary winding L3_3 of the transformer is also connected to a third rectifier switch Q4 and a fourth rectifier switch Q5, and thus forms a second diagonal.

As is shown in FIG. 6, the first rectifier switch Q3 and the second rectifier switch Q6 of the first diagonal in particular are connected synchronously to the low-side inverter switch Q2, while the third rectifier switch Q4 and the fourth rectifier switch Q5 can be synchronously activated with the high-side inverter switch Q1. Other activations of the rectifier switches are also possible thereby. The important thing, however, is that the control unit SE" recognizes the polarity currently present at the secondary side of the circuit, and activates the rectifiers switches Q3, Q4, Q5, Q6 of the two diagonals accordingly.

In comparison to the passive rectifiers PG, PG' from FIGS. 2 and 3, by switching the tapping into the secondary winding L3_3, the error inducing "reverse current" is measured as negative current, such that, by means of the control unit SE", the illuminant current can be obtained through a corresponding activation of the switch unit S on the primary side of the circuit. The "reverse current" can then be compensated for through such an activation.

The recording of the parameter reflecting the current passing through the illuminant can then occur by means of an integration circuit I, in particular an RC integration circuitry. By way of example, a return signal can be recorded by the control unit SE" at a voltage divider, which is formed by the resistors R1, R2, at the midpoint thereof. The voltage divider R1, R2 is connected in parallel to capacitor C3 thereby. The rectified output signal is supplied to the parallel connection from the active measurement rectifier AG' at the higher potential terminal of the capacitor C3.

It is to be understood thereby that in both the first as well as the second diagonal, in each case one rectifier switch can be replaced by a diode.

FIGS. 7a and 7b show measurement circuit diagrams for various states of the active rectifier: If the active measurement rectifier AG, AG' is operated by the control circuit SE" such that in each case only one diagonal is active, then positive and negative currents are supplied directly to the RC integration circuitry I, comprising the capacitor C3, as well to as the voltage divider connected in parallel thereto, having the resistors R1 and R2. The polarity of the secondary winding L3_3 is distinguished thereby, which is synchronous to the activation of the inverter switches Q1 and Q2.

If the measurement rectifier AG, AG' is operated in the proximity of the resonance frequency of the converter (LLC in this case), then a current flows in the down time of the inverter, i.e. in the time in which neither of the inverter switches Q1 and Q2 is active. The current then flows through the body diodes of the rectifier switches Q3-Q6, and thus likewise in the RC integration circuit I. This occurs, however, only with very high loads, and the error caused thereby is marginal in comparison with the error that occurs with the use of a passive rectifier PG, PG'.

The invention thus relates in general to the recording of a measurement signal at the primary windings L3_1, L3_2 of a transformer, which are connected in series to diodes D1, D2, wherein the secondary winding L3_3 of the transformer is connected as a diagonal of an active bypass circuit (in particular a full bypass circuit). The activation of the rectifier switches Q3-Q6 preferably occurs thereby through direct use of the control signal of the at least one clocked switch S of the converter provided on the secondary side. Thus, a further measurement input is no longer necessary on the control unit SE', SE", and an activation of the rectifier switches Q3-Q6 can occur without a separate drive circuit. The primary windings L3_1, L3_2 are thus connected directly into the power supply paths of the illuminant line.

Figure 7:
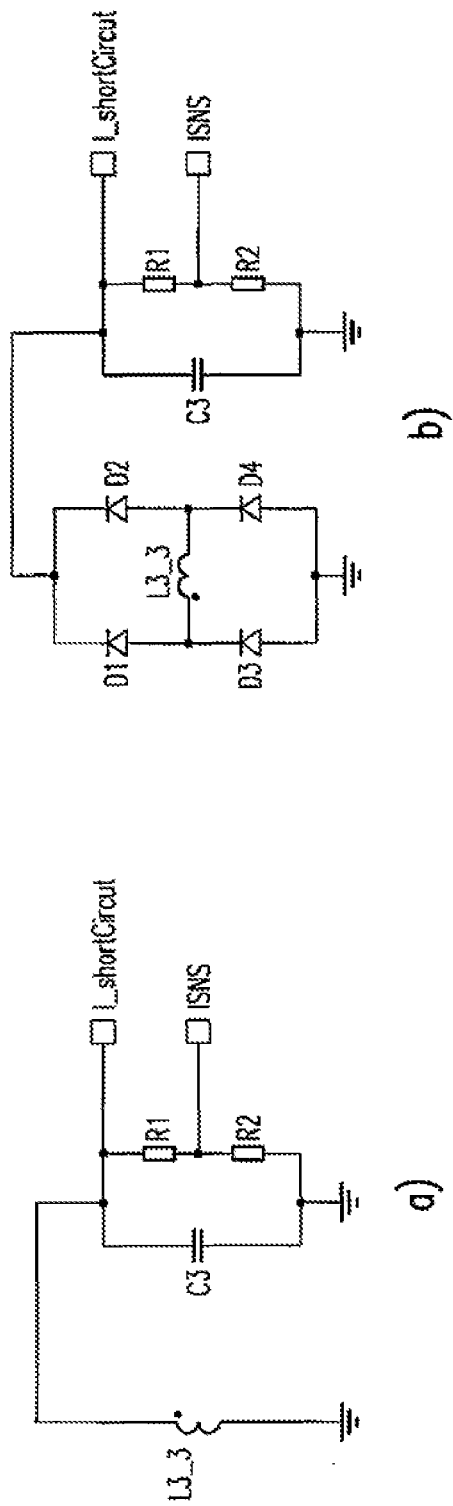
FIG. 7 shows states of circuit components in specific activations.

A down time is provided between the active switching of the two diagonals, in which neither of the two diagonals is active, i.e. activated. As is shown in FIG. 7, the so-called body diodes of the rectifier switch assume the rectifier functions in this down time, such that in this time period, there is no active measurement rectifier in the circuit, but rather a passive measurement rectifier.

It is to be understood that the switches described above may be designed as transistors (e.g. FET, MOSFET, . . . ). The control units SE, SE" can be designed as IC or ASIC microcontrollers.

What is claimed is:

1. A drive circuit for operating an illuminant, including at least one LED, said drive circuit comprising an isolated converter, clocked on the primary side by a control unit by means of at least one activated switch unit, which feeds a rectifier on a secondary side of the converter, from which the illuminant can be supplied with power; and a measurement circuit having a transformer with at least one primary side winding for an indirect measurement of the current on the secondary side of the converter;
   wherein the measurement circuit has an active measurement rectifier; and
   further wherein the control unit controls rectifier switches of the active rectifier of the measurement circuit, depending on the activation of the at least one switch unit.

2. The drive circuit according to claim 1, wherein a parameter reflecting the current passing through the illuminant is returned to the control unit from an output of the measurement circuit, and the output is connected directly or indirectly to a measurement input of the control unit.

3. The drive circuit according to claim 1, wherein the switch unit is a half-bridge or full-bridge inverter.

4. The drive circuit according to claim 1, wherein the at least one primary side winding is a component of a resonance converter, an LLC circuit, a flyback converter, a push-pull converter, a step-up or step-down converter.

5. The drive circuit according to claim 1, wherein the switch unit comprises at least one switch, comprising a transistor, FET or MOSFET.

6. A drive circuit for operating an illuminant, including at least one LED, said drive circuit comprising an isolated converter, clocked on the primary side by a control unit by means of at least one activated switch unit, which feeds a rectifier on a secondary side of the converter, from which the illuminant can be supplied with power; and a measurement circuit having a transformer with at least one primary side winding for an indirect measurement of the current on the secondary side of the converter;
   wherein the measurement circuit has an active measurement rectifier; and
   further wherein the control unit activates and deactivates a first diagonal of the active rectifier synchronously with a first inverter switch, and wherein the control unit activates and deactivates a second diagonal of the active rectifier synchronously with a second inverter switch, and wherein, in each case, only the first or the second diagonal is active.

7. The drive circuit according to claim 6, wherein a secondary winding of the transformer is a component of each of the diagonals of the active measurement rectifier.

8. A drive circuit for operating an illuminant, including at least one LED, said drive circuit comprising an isolated converter, clocked on the primary side by a control unit by means of at least one activated switch unit, which feeds a rectifier on a secondary side of the converter, from which the illuminant can be supplied with power; and a measurement circuit having a transformer with at least one primary side winding for an indirect measurement of the current on the secondary side of the converter;
   wherein the measurement circuit has an active measurement rectifier; and
   further wherein a first and a second diagonal of the active measurement rectifier each have at least one rectifier switch that is connected to a terminal of the secondary winding of the transformer.

9. The drive circuit according to claim 8, wherein a diagonal comprises, in each case, one rectifier switch and one diode.

10. The drive circuit according to claim 8, wherein the control unit first activates a diagonal of the active rectifier after a down time following the deactivation of another diagonal of the active measurement rectifier.

* * * * *